(12) United States Patent
Yen

(10) Patent No.: US 7,304,523 B2
(45) Date of Patent: Dec. 4, 2007

(54) CLOCK GENERATING APPARATUS AND METHOD IN OPTICAL STORAGE SYSTEM

(75) Inventor: Kuang-Yu Yen, Tai-Chung (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 11/164,827

(22) Filed: Dec. 7, 2005

(65) Prior Publication Data

US 2006/0197564 A1    Sep. 7, 2006

(30) Foreign Application Priority Data

Dec. 8, 2004    (TW) .............. 93138039 A

(51) Int. Cl.
*G06F 1/04* (2006.01)
(52) U.S. Cl. ...................... 327/291; 327/160
(58) Field of Classification Search ............ None
See application file for complete search history.

(56) References Cited

U.S. PATENT DOCUMENTS

| | | | |
|---|---|---|---|
| 5,335,018 A | | 8/1994 | Mohlmann et al. |
| 5,920,214 A | * | 7/1999 | Lee et al. .................. 327/147 |
| 6,111,831 A | * | 8/2000 | Alon et al. .............. 369/47.16 |
| 6,885,252 B2 | * | 4/2005 | Hsu ........................... 331/17 |
| 6,914,862 B2 | * | 7/2005 | Tsai et al. ................ 369/47.41 |

* cited by examiner

*Primary Examiner*—Cassandra Cox
(74) *Attorney, Agent, or Firm*—Wiston Hsu

(57) ABSTRACT

A clock generating apparatus and clock generating method of an optical disc drive for calibrating a clock signal according to an input signal. The clock generating apparatus includes a frequency detector for detecting sampling times in a duration when the clock signal samples an interval between two synchronization patterns of the input signal, and for generating a first adjusting signal according to the sampling times, and a signal generator electrically coupled to the frequency detector for calibrating the clock signal according to the first adjusting signal.

20 Claims, 5 Drawing Sheets

CLOCK GENERATING APPARATUS AND METHOD IN OPTICAL STORAGE SYSTEM

BACKGROUND OF THE INVENTION

1. Field of the Invention

The invention relates to optical storage systems, and more particularly, to a clock generator and clock generating method of optical storage systems.

2. Description of the Prior Art

A phase lock loop (PLL) is an essential component of an optical disk drive, for generating needed clock signals for the operation of the optical disk drive. In this way, the optical disk drive can sample the stored data on the optical disk according to the clock signal generated by the PLL. Please refer to FIG. 1, which is a diagram of a typical PLL 100. The PLL 100 comprises a phase detector (PD) 110, a frequency detector (FD) 112, a charge pump 114, a loop filter 116, and a voltage-controlled oscillator (VCO) 118. The functions and operations of the charge pump 114, the loop filter 116, and the VCO 18 are well known and details are thus omitted herein. Because the frequency of the signal read by the optical disk drive from the optical disk varies (for example, the linear velocity of the inner groove is different from that of the outer groove), the PLL 100 first activates the FD 112 to force the frequency of an output clock signal CLK to approach and become roughly equal to the frequency of an input signal $S_{in}$. Then, the PLL 100 utilizes the PD 110 to tune the clock signal CLK so that the phase and the frequency of the clock signal can accurately lock on the phase and the frequency of the input signal $S_{in}$. This makes the PLL 100 more efficient than a PLL utilizing only a PD to lock on the input signal $S_{in}$.

Generally speaking, the FD 112 detects whether the frequency of the clock signal CLK approaches the desired frequency according to a sampling result of a longest signal pulse of the input signal $S_{in}$, for example, of an Eight-to-Fourteen Modulation (EFM) signal from an optical disk. If the sampling result of the longest pulse appears longer than a nominal longest length (in the case of DVD, 14T, where T represents the period of the clock signal), then it is determined that the frequency of the clock signal CLK is too high, and the FD 112 should control the VCO 18 to reduce the frequency of the clock signal CLK. If the sampling results of the longest pulses within a certain period of time fail to exceed the nominal longest length, then it is determined that the frequency of the clock signal CLK is too low, and the FD 112 controls the VCO 18 to raise the frequency of the clock signal CLK. Therefore, after a period of time, the frequency of the clock signal CLK controlled by the FD 112 will resemble to a certain degree the desired frequency, and then the PLL 100 will switch to the PD 110 to accurately control the VCO 18 and to lock on the desired clock signal CLK.

However, according to the aforementioned, there still exists a problem. Please refer to FIG. 2, which is a diagram of an EFM signal of a DVD system. As shown in FIG. 2, the sections labeled "A" indicate the above-mentioned longest signal pulse, which is a nominal 14T synchronization pattern in this illustration, where T is the sampling period. As a result, the resolution of frequency estimation is 1/14, or, in other words, the error possibly caused is 1/14. In a CD system, the longest pulse is even as short as 11T, which means a resolution of 1/11, or a possible error of 1/11. Therefore, the method of utilizing the pulse width to evaluate the frequency is not satisfactorily accurate. Due to the inaccuracy of frequency detection and estimation, when the PLL 100 switches to the PD 110 to lock on the clock signal CLK, the PLL 100 has to spend more time utilizing the PD 110 to lock the clock signal CLK onto the input signal $S_{in}$.

SUMMARY OF THE INVENTION

It is therefore one of the objectives of the claimed invention to provide a clock generator and clock generating method having a high resolution FD.

According to an exemplary embodiment of the claimed invention, a clock generator utilized in an optical disk drive for generating a clock signal according to an input signal is disclosed. The clock generator comprises: a frequency detector for receiving the input signal and the clock signal in order to generate a first adjusting signal; and a signal generator coupled to the frequency detector for receiving the first adjusting signal to generate the clock signal; wherein the frequency detector detects an interval between a first pattern and a second pattern of the input signal to control the operation of the optical disk drive.

In addition, a clock generating method utilized in an optical disk drive for generating a clock signal according to an input signal is disclosed. The clock generating method comprises: receiving the input signal; receiving the clock signal; sampling the input signal according to the clock signal to generate a count value, where the count value corresponds to an interval between a first pattern and a second pattern of the input signal; and generating the clock signal according to the count value.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
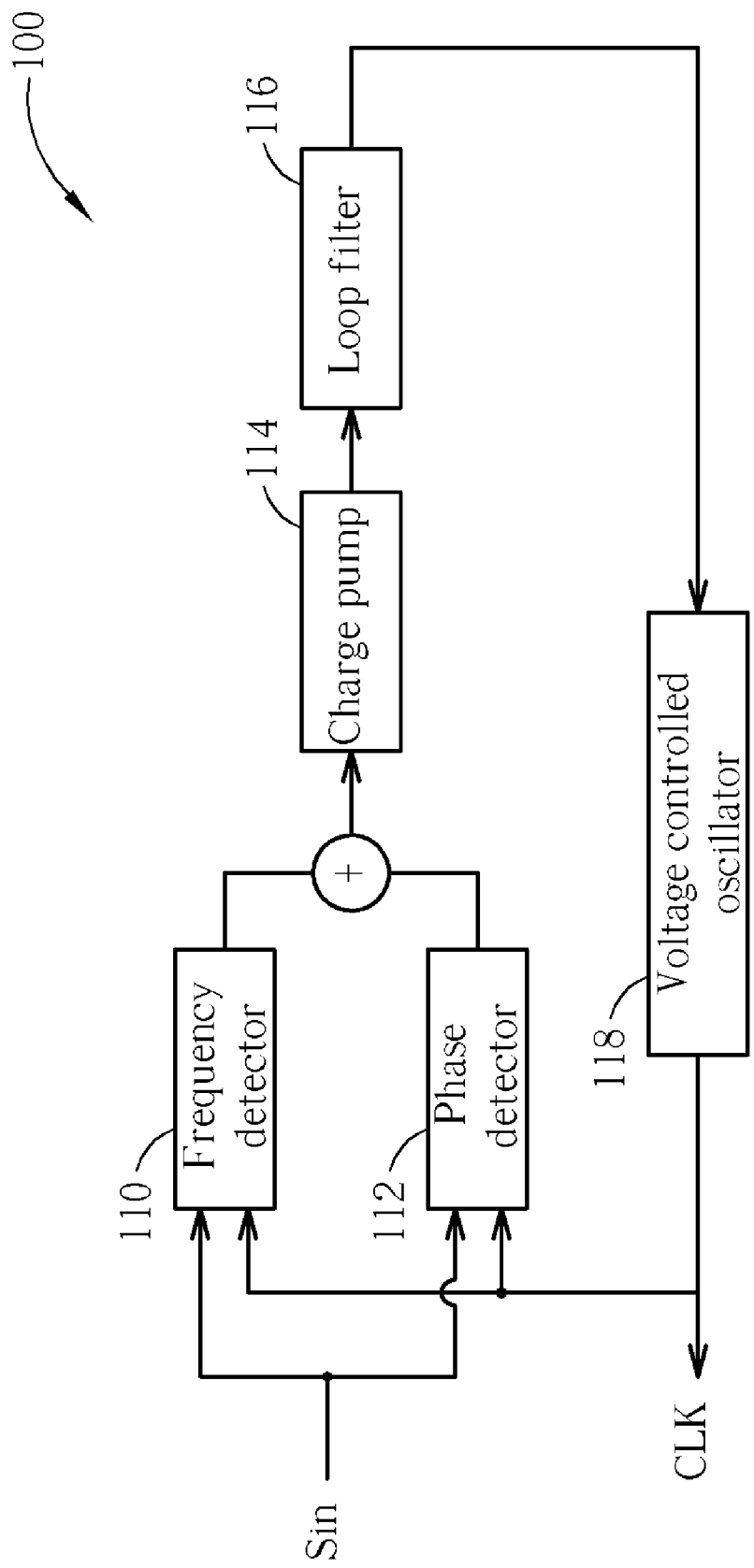
FIG. 1 is a diagram illustrating a typical PLL.
Figure 2:
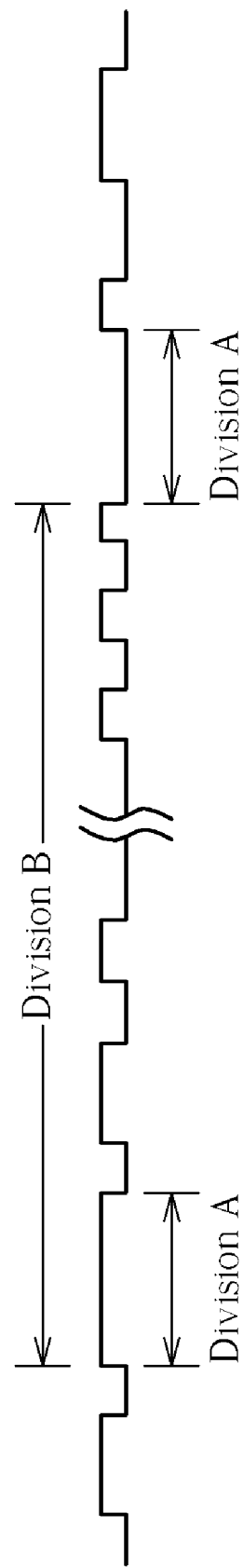
FIG. 2 is a diagram of input signals of a DVD system.

Please again refer to FIG. 2. As shown in FIG. 2, a DVD system (such as a DVD optical disk drive) not only detects a 14T synchronization pattern (section A), but also defines a 1488T interval (section B) between two synchronization patterns (that is, a frame). Utilizing the 1488T interval to lock on the frequency can reduce the potential error of frequency estimation to 1/1488. Therefore, the following embodiments of the present invention utilize the corresponding interval between two synchronization patterns to evaluate the frequency so that the resolution of the FD is raised.

Figure 3:
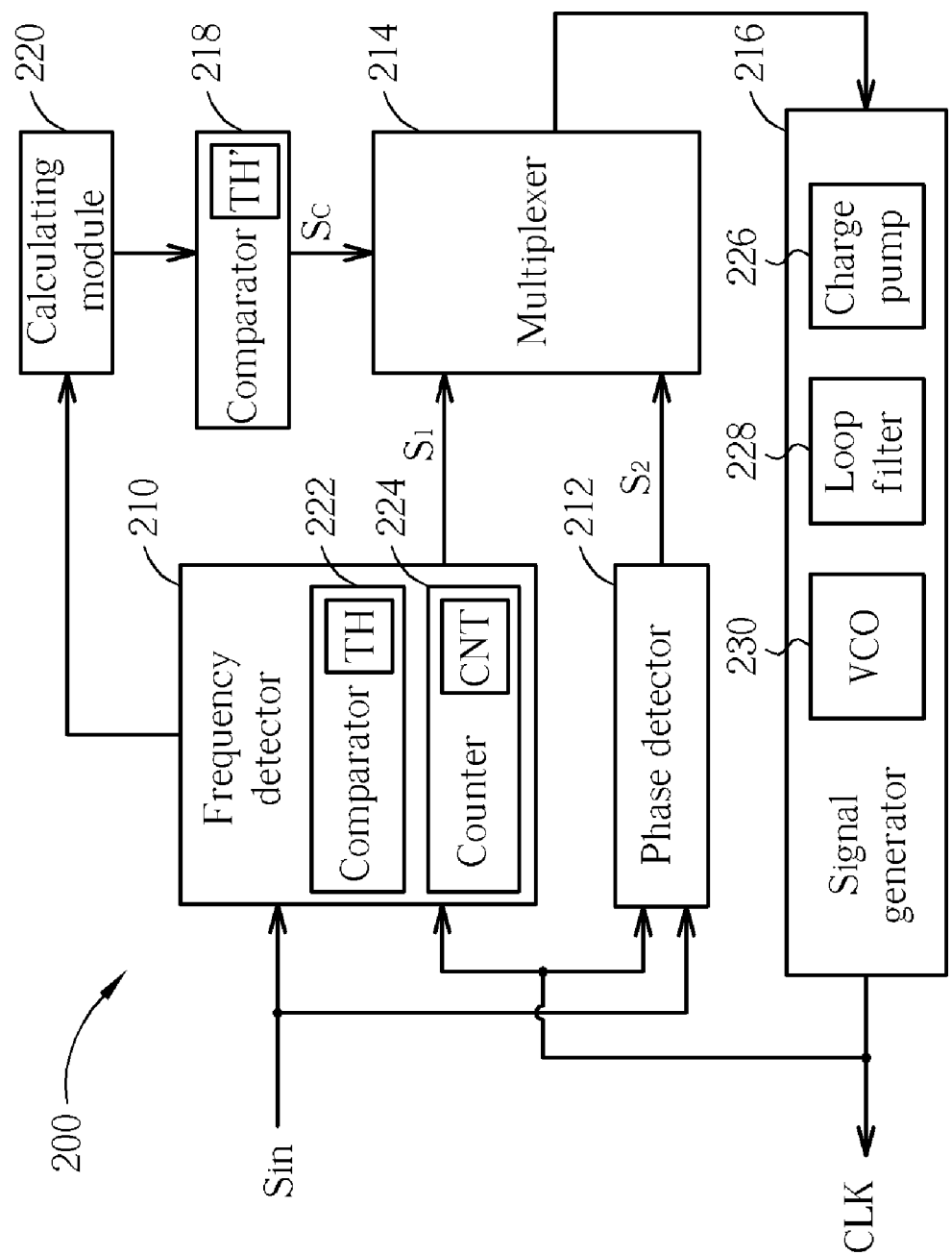
FIG. 3 is a diagram of a clock generator according to an embodiment of the present invention.

Please refer to FIG. 3, which shows a clock generator 200 according to an embodiment of the present invention. The clock generator 200 comprises an FD 210, a PD 212, a multiplexer 214 coupled to the FD 210 and the PD 212, a signal generator 216 coupled to the multiplexer 214, a comparator 218 coupled to the multiplexer 214, and a calculating module 220 coupled to the FD 210 and the comparator 218. In this embodiment, the signal generator 216 comprises, but not limited to, a charge pump 226, a loop filter 228, and a VCO 230. In this embodiment, the desired clock signal CLK is outputted by the signal generator 316. Since the charge pump 226, the loop filter 228, and the VCO 230 are common components of a clock-generating device, the functions and operations thereof are well known in the art and are thus omitted herein. Please note that the FD 210 comprises a comparator 222 and a counter 224. As known by those skilled in the optical storage art, the clock generator 200 typically generates a clock signal CLK according to an input signal $S_{in}$, such as an EFM signal read back from an optical disk.

Figure 4:
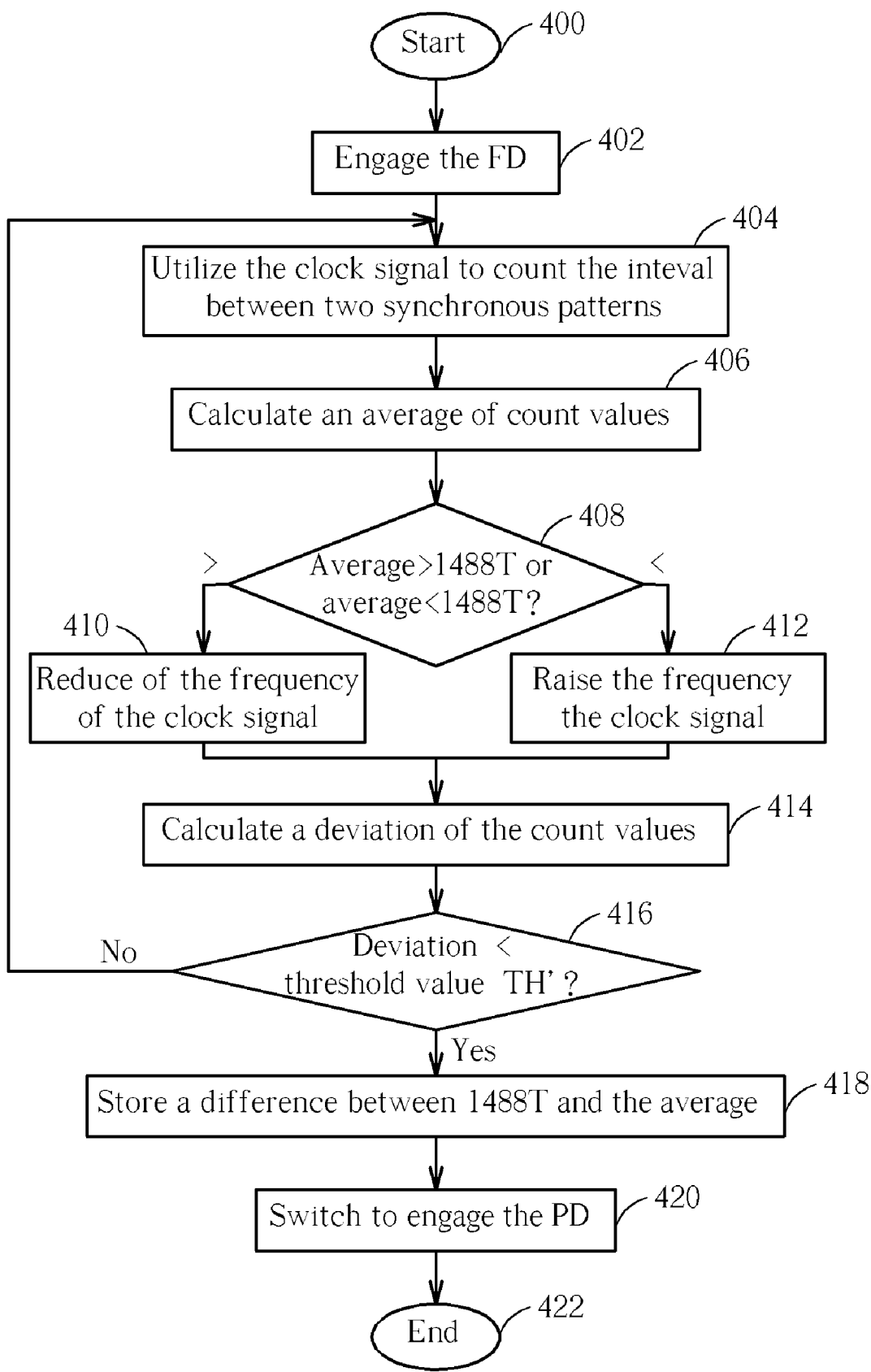
FIG. 4 is a flow chart illustrating the clock generator shown in FIG. 3 generating a clock signal.

Please refer to FIG. 4 in conjunction with FIG. 3. FIG. 4 is a flow chart illustrating the clock generator 200 shown in FIG. 3 generating a clock signal. The operation is illustrated as follows. First, die clock generator 200 operates to engage the FD 210 when encountering certain events, for example, events that result in significant change in signal frequency such as track jumping (step 402), and controls the multiplexer 214 to switch the FD 210 into the frequency locking loop. This makes the signal generator 216 generate the clock signal CLK according to the adjusting signal $S_1$ outputted by the FD 210. Subsequently, the counter 224 of the FD 210 utilizes the clock signal CLK generated by the signal generator 216 as the sampling signal to count the interval between two synchronization patterns of the input signal $S_{in}$ (step 404). This means that the count value CNT stored in the counter 224 corresponds to the number of periods of the clock signal CLK representing the length of interval between two synchronization patterns. In addition, the FD 210 also performs an averaging calculation on a plurality of stored count values CNTs, which represent the interval between the two synchronization patterns, to obtain an average (step 406). The FD 210 utilizes the comparator 222 to compare the average with a threshold value TH (in the case of a DVD system, the threshold value TH is 1488) (step 408). If the average is larger than 1488, this represents that the frequency of the clock signal CLK is too high. In this case, the adjusting signal $S_1$ of the FD 210 controls the signal generator 246 to reduce the frequency of the clock signal CLK (step 410). On the other hand, if the average is less than 1488, this represents that the frequency of the clock signal CLK is too low. In this case, the adjusting signal $S_1$ controls the signal generator 216 to raise the frequency of the clock signal CLK (step 412), In addition to the operation of the above-mentioned FD 210, the calculating module 220 further performs a standard deviation calculation on the plurality of count values CNTs stored in the FD 210 obtained during a certain period of time, to obtain a standard deviation (step 414). The comparator 218 compares the standard deviation with a threshold value TH' (step 416). If the deviation is no less the threshold value TH', this represents that the count values CNTs, which represent the interval between the two synchronization patterns, are not yet stable. Therefore, the FD 210 repeatedly performs steps 404 through 416. If the standard deviation becomes less than the threshold value TH', this represents that the interval between the two synchronization patterns appears stable. Therefore, the signal generator 216 stores an offset, which represents the difference between the average and the threshold value 1488 (step 418). The comparator 218 then changes the switching signal Sc and controls the multiplexer 214 to switch the PD 312 into the locking loop (step 420). Finally, the signal generator 246 tunes the input signal $S_{in}$ according to the adjusting signal $S_2$ generated by the PD 212 and meanwhile referencing the stored offset.

Figure 5:
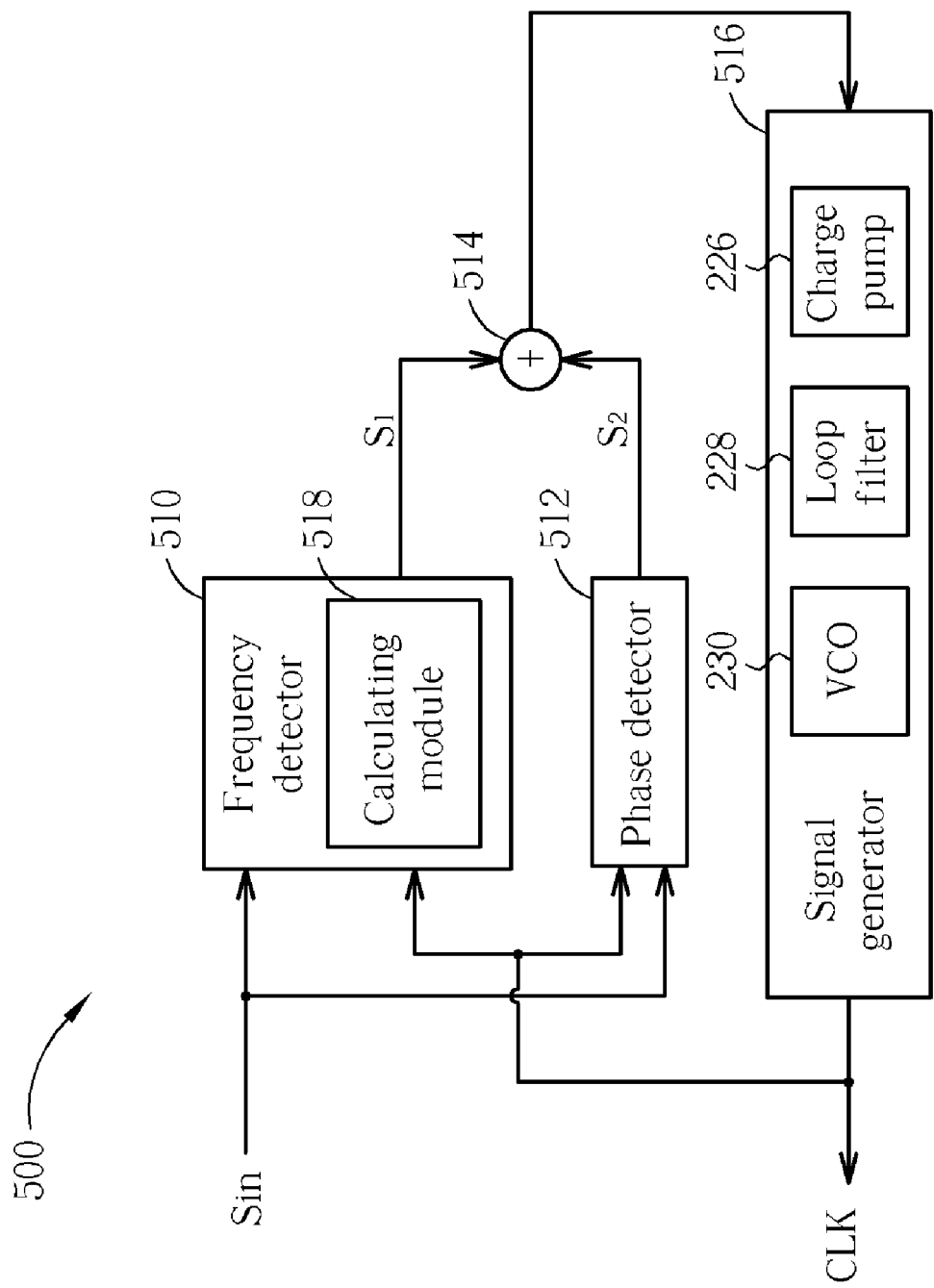
FIG. 5 is a diagram of a clock generator of another embodiment according to the present invention.

Those shown in FIG. 4 illustrate a preferred embodiment realized in digital form, wherein the components such as the frequency detector 210, the phase detector 212, the multiplexer 214, the charge pump 226, the loop filter 228 are all implemented with digital circuitry. However, one of ordinary skill in the art should be able to appreciate that a clock generator implemented in analog form can also be operated conforming to the spirit of the present invention, and thus falls within the scope of the invention. Please refer to FIG. 5, which is a diagram of a clock generator 500 of another embodiment according to the present invention and serves as an example thereof. In FIG. 5, the output signals of the FD 510 and the PD 512 are summed by an adder 514. The summed signal is then inputted as control to the signal generator 516 in order to generate the clock signal CLK. In this embodiment, the operations of the comparator, the counter of the FD 210, the calculating module 220, and the comparator 218 shown in FIG. 2 can be accomplished through the calculating module 218 of the FD 510. Furthermore, the signal outputted by the FD 510 to the adder 514 can be fixed to a specific value when the standard deviation becomes less than the threshold value TH', and then the PD 512 can be utilized to tune the clock CLK.

Please note that in the above-mentioned embodiment, although the interval between the two synchronization patterns is 1488T in the DVD system, the interval between the two synchronization patterns is 588T in the CD system. As known by those skilled in the art, length of interval between other types of pulses in the signal can also be utilized in the embodiment according to the present invention. Furthermore, the detection of interval between the signal pulses of the present invention can be implemented in conjunction with the conventional method of detecting the longest pulse to perform the locking operation so that the locking operation can be performed most effectively.

The clock generator and the clock generating method in the described embodiments of the invention take the advantage of a much longer interval of 1488T between two synchronous patterns than the length of the longest pulse 14T, so that the FD has a higher resolution. It follows that when the PLL switches to the PD to lock on the clock signal, the PD can lock the clock signal onto the input signal much more quickly. This can make a constant-angular-velocity optical disk drive lock on a desired clock signal more quickly after the constant-angular-velocity optical disk drive performs a track-jumping operation. In other words, the present invention clock generator and the clock generating method can raise the overall efficiency of the optical disk drive. For example, the optical disk drive can perform reading, writing, or decoding operations more efficiently.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock generator in an optical disk drive for generating a clock signal according to an input signal, the clock generator comprising:
   a frequency detector receiving the input signal and the clock signal, for generating a first adjusting signal; and
   a signal generator coupled to the frequency detector, for receiving the first adjusting signal and generating the clock signal;
wherein the frequency detector detects an interval between a first pattern and a second pattern of the input signal to control the operation of the optical disk drive, and each of the first pattern and the second pattern comprises at least one pulse.

2. The clock generator of claim 1, wherein the input signal is a modulation signal read by the optical disk drive.

3. The clock generator of claim 2, wherein the first pattern and the second pattern are both synchronization patterns of the input signal.

4. The clock generator of claim 1, wherein the frequency detector utilizes the clock signal for sampling the input signal to generate a count value, the count value corresponding to the interval between the first pattern and the second pattern.

5. The clock generator of claim 4, wherein the frequency detector comprises a first circuit for calculating an average of the count value.

6. The clock generator of claim 4 further comprising a second circuit for calculating a deviation of the count value.

7. The clock generator of claim 1, wherein the frequency detector controls the signal generator to change the clock signal through the first adjusting signal according to the interval between the first pattern and the second pattern.

8. The clock generator of claim 1, further comprising:
a phase detector for receiving the input signal and the clock signal to generate a second adjusting signal;
wherein the optical disk drive operates according to the interval between the first pattern and the second pattern to make the signal generator generate the clock signal according to the second adjusting signal.

9. The clock generator of claim 1, wherein the optical disk drive is a DVD optical disk drive.

10. A clock generating method of an optical disk drive for generating a clock signal according to an input signal, the clock generating method comprising:
receiving the input signal;
receiving the clock signal;
sampling the input signal according to the clock signal to generate a count value, the count value corresponding to an interval between a first pattern and a second pattern of the input signal, wherein each of the first pattern and the second pattern comprises at least one pulse; and
generating the clock signal according to the count value.

11. The clock generating method of claim 10, wherein the input signal is a modulation signal read by the optical disk drive.

12. The clock generating method of claim 11, wherein the first pattern and the second pattern are both synchronization patterns of the input signal.

13. The clock generating method of claim 10 further comprising:
calculating an average of the count value.

14. The clock generating method of claim 10 further comprising:
calculating a deviation of the count value.

15. The clock generating method of claim 10 further comprising:
switching to compare a phase difference between the clock signal and the input signal.

16. The clock generating method of claim 10, wherein the optical disk drive is a DVD disk drive.

17. A clock generator in an optical disk drive for generating a clock signal according to an input signal, the clock generator comprising:
a frequency detector receiving the input signal and the clock signal, for generating a first adjusting signal; and
a signal generator coupled to the frequency detector, for receiving the first adjusting signal and generating the clock signal;
wherein the frequency detector detects an interval between a first pattern and a second pattern of the input signal to control the operation of the optical disk drive, and utilizes the clock signal for sampling the input signal to generate a count value corresponding to the interval between the first pattern and the second pattern; and the frequency detector comprises a first circuit for calculating an average of the count value.

18. A clock generator in an optical disk drive for generating a clock signal according to an input signal, the clock generator comprising:
a frequency detector receiving the input signal and the clock signal, for generating a first adjusting signal;
a signal generator coupled to the frequency detector, for receiving the first adjusting signal and generating the clock signal; and
a second circuit;
wherein the frequency detector detects an interval between a first pattern and a second pattern of the input signal to control the operation of the optical disk drive, and utilizes the clock signal for sampling the input signal to generate a count value corresponding to the interval between the first pattern and the second pattern; and the second circuit calculates a deviation of the count value.

19. A clock generating method of an optical disk drive for generating a clock signal according to an input signal, the clock generating method comprising:
receiving the input signal;
receiving the clock signal;
sampling the input signal according to the clock signal to generate a count value, the count value corresponding to an interval between a first pattern and a second pattern of the input signal;
calculating an average of the count value; and
generating the clock signal according to the count value.

20. A clock generating method of an optical disk drive for generating a clock signal according to an input signal, the clock generating method comprising:
receiving the input signal;
receiving the clock signal;
sampling the input signal according to the clock signal to generate a count value, the count value corresponding to an interval between a first pattern and a second pause of the input signal;
calculating a deviation of the count value; and
generating the clock signal according to the count value.

* * * * *